(12) United States Patent
Morikazu et al.

(10) Patent No.: US 12,151,312 B2
(45) Date of Patent: Nov. 26, 2024

(54) LASER PROCESSING APPARATUS

(71) Applicant: DISCO CORPORATION, Tokyo (JP)

(72) Inventors: Hiroshi Morikazu, Tokyo (JP);
Nobuyuki Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 18/184,973

(22) Filed: Mar. 16, 2023

(65) Prior Publication Data

US 2023/0219169 A1 Jul. 13, 2023

Related U.S. Application Data

(62) Division of application No. 17/199,759, filed on Mar. 12, 2021, now abandoned.

(30) Foreign Application Priority Data

Mar. 30, 2020 (JP) ................. 2020-059800

(51) Int. Cl.
| | | |
|---|---|---|
| *B23K 26/364* | (2014.01) | |
| *B23K 26/06* | (2014.01) | |
| *B23K 26/073* | (2006.01) | |
| *B23K 26/082* | (2014.01) | |
| *B23K 26/359* | (2014.01) | |

(Continued)

(52) U.S. Cl.
CPC ........ *B23K 26/364* (2015.10); *B23K 26/0665* (2013.01); *B23K 26/073* (2013.01); *B23K 26/082* (2015.10); *B23K 26/359* (2015.10); *B23K 26/402* (2013.01); *H01L 33/0093* (2020.05); *B23K 2103/56* (2018.08); *B32B 7/12* (2013.01); *B32B 9/041* (2013.01); *B32B 15/043* (2013.01); *B32B 15/20* (2013.01);

*B32B 43/006* (2013.01); *B32B 2311/04* (2013.01); *B32B 2311/06* (2013.01); *B32B 2311/09* (2013.01);

(Continued)

(58) Field of Classification Search
CPC .. B23K 26/00; B23K 2103/56; B23K 26/402; B23K 26/0665; B23K 26/082; B23K 26/364
USPC ................................... 219/121.69
See application file for complete search history.

(56) References Cited

U.S. PATENT DOCUMENTS

2006/0231853 A1* 10/2006 Tanaka .................... H01L 33/62
257/99
2015/0017434 A1 1/2015 Dronen et al.
(Continued)

FOREIGN PATENT DOCUMENTS

CN 106166649 B * 2/2018
JP 10305420 A 11/1998
(Continued)

*Primary Examiner* — Nathaniel E Wiehe
*Assistant Examiner* — Spencer H. Kirkwood
(74) *Attorney, Agent, or Firm* — Greer, Burns & Crain, Ltd.

(57) ABSTRACT

A laser beam irradiation unit of a laser processing apparatus includes a laser oscillator that oscillates a laser, a Y-axis scanner that executes a high-speed scan with a laser beam emitted from the laser oscillator in a Y-axis direction, an X-axis scanner that executes processing feed of the laser beam emitted from the laser oscillator in an X-axis direction, and a beam condenser. The Y-axis scanner is selected from any of an AOD, a resonant scanner, and a polygon scanner and the X-axis scanner is selected from a galvano scanner and a resonant scanner.

1 Claim, 5 Drawing Sheets

(51) Int. Cl.
  *B23K 26/402* (2014.01)
  *B23K 103/00* (2006.01)
  *B32B 7/12* (2006.01)
  *B32B 9/04* (2006.01)
  *B32B 15/04* (2006.01)
  *B32B 15/20* (2006.01)
  *B32B 43/00* (2006.01)
  *H01L 33/00* (2010.01)

(52) U.S. Cl.
  CPC ....... *B32B 2311/12* (2013.01); *B32B 2315/00* (2013.01)

(56) References Cited

U.S. PATENT DOCUMENTS

| | | |
|---|---|---|
| 2016/0243646 A1 | 8/2016 | Kleinert et al. |
| 2019/0041620 A1* | 2/2019 | Mikami ............. G02B 21/0068 |
| 2019/0088816 A1* | 3/2019 | Mori ........................ H01L 33/32 |
| 2019/0115494 A1 | 4/2019 | Koyanagi et al. |

FOREIGN PATENT DOCUMENTS

| | | |
|---|---|---|
| JP | 2013021225 A | 1/2013 |
| JP | 2015513211 A | 4/2015 |
| JP | 2015223771 A | 12/2015 |
| JP | 2018008307 A | 1/2018 |
| JP | 2018507782 A | 3/2018 |
| JP | 2019075480 A | 5/2019 |
| WO | 2012056715 A1 | 3/2014 |

* cited by examiner

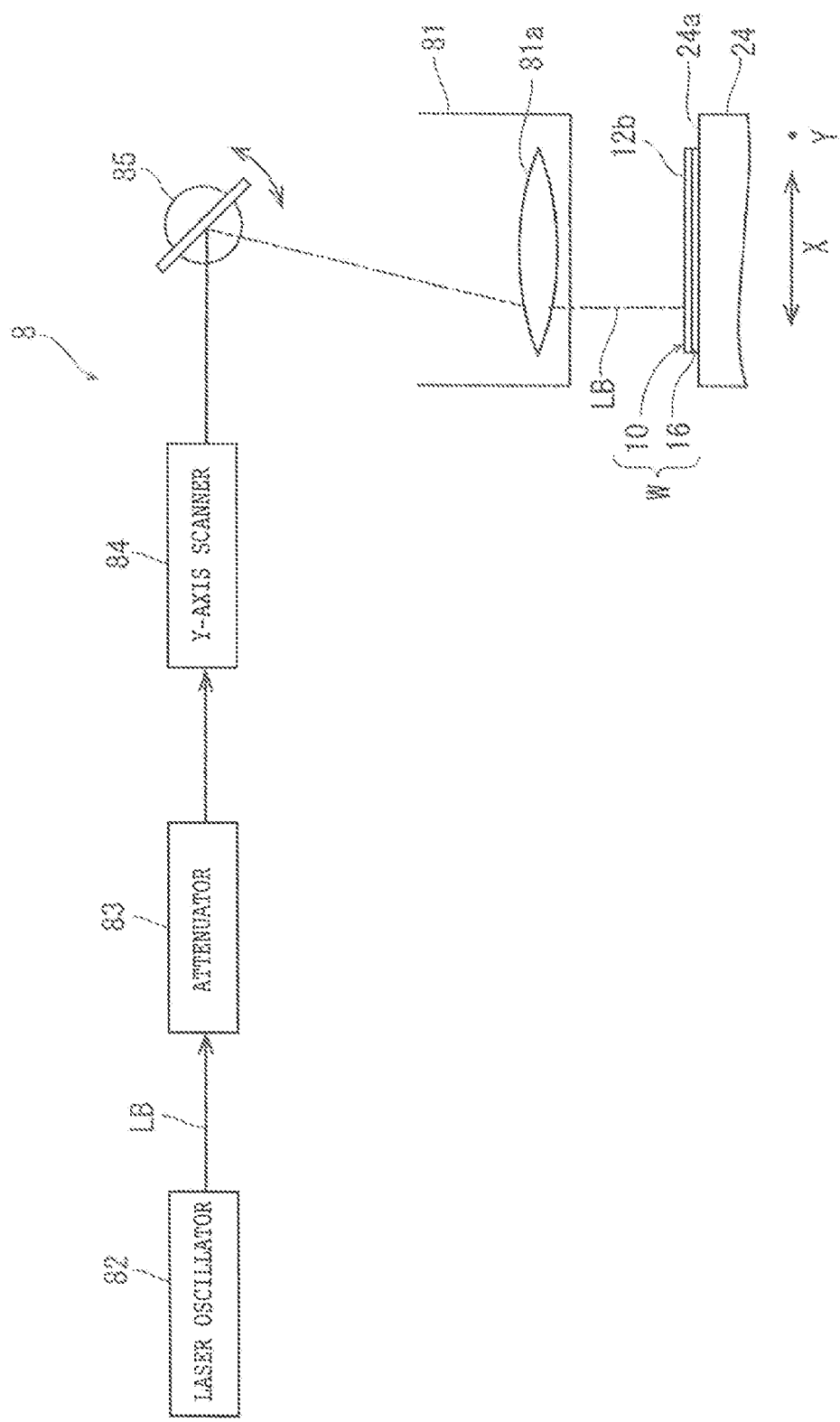

LASER PROCESSING APPARATUS

CROSS-REFERENCE TO RELATED APPLICATIONS

This is a divisional application of co-pending U.S. application Ser. No. 17/199,759, filed on Mar. 12, 2021, which claimed priority to JP 2020-059800, filed Mar. 30, 2020, the contents of each application are incorporated by reference.

BACKGROUND OF THE INVENTION

Field of the Invention

The present invention relates to a laser processing apparatus including a laser beam irradiation unit that irradiates a workpiece with a laser beam to form a broken layer.

Description of the Related Art

There is a wafer in which a buffer layer and a light emitting layer including an epitaxial layer composed of an n-type semiconductor layer and a p-type semiconductor layer and plural electrodes disposed on the n-type semiconductor layer and the p-type semiconductor layer are stacked by epitaxial growth over the upper surface of an epitaxy substrate such as a sapphire substrate or a silicone carbide (SiC) substrate and plural light emitting diodes (LEDs) are formed in this light emitting layer in such a manner as to be marked out by plural planned dividing lines that intersect. This wafer is divided together with the epitaxy substrate along the planned dividing lines by a laser beam or the like and individual LED chips are manufactured (for example, refer to Japanese Patent Laid-open No. 10-305420).

Furthermore, in order to improve the luminance of the LEDs and enhance the cooling effect, the following technique has been proposed by the present assignee. Specifically, a transfer substrate such as a molybdenum substrate, a copper substrate, or a silicon substrate is joined to the light emitting layer with the intermediary of a joining material (indium, palladium, or the like) to form a layer-stacking wafer. Thereafter, the buffer layer is irradiated with a laser beam from the epitaxy substrate side and the buffer layer is broken to form a broken layer. Then, this light emitting layer is transferred to the transfer substrate side (refer to Japanese Patent Laid-open No. 2013-21225).

SUMMARY OF THE INVENTION

By the way, in recent years, a diameter of a wafer to generate LEDs has been increasing to 200 mm, 300 mm, and so forth and there has been a problem that a throughput until individual LEDs are generated through processing of the wafer lowers. It is conceivable that, in order to enhance this throughput, a spot diameter is increased to be on the order of several millimeters, for example, when irradiation with a laser beam that breaks a buffer layer is executed from the epitaxy substrate side. However, when the spot diameter is increased, energy of a pulse laser beam becomes higher in proportion to an area of the spot, so that the heat dissipation rate lowers. Thus, a problem occurs that heat accumulation occurs at a laser beam irradiation position on a wafer side and LEDs near the position irradiated with the laser beam are damaged.

Thus, an object of the present invention is to provide a laser processing apparatus excellent in the throughput without increasing the spot diameter of a laser beam.

In accordance with an aspect of the present invention, there is provided a laser processing apparatus including a chuck table that holds a workpiece and includes a holding surface defined by an X-axis and a Y-axis and a laser beam irradiation unit that irradiates the workpiece held by the chuck table with a laser beam and forms a broken layer. The laser beam irradiation unit includes a laser oscillator that oscillates a laser, a Y-axis scanner that executes a high-speed scan with a laser beam emitted from the laser oscillator in a Y-axis direction, an X-axis scanner that executes processing feed of the laser beam emitted from the laser oscillator in an X-axis direction, and a beam condenser. The spot diameter (D) of the laser beam with which the workpiece is irradiated is set to 5 to 60 μm. The overlap rate (K) of the spot of the laser beam is set to 0.70 to 0.99. The scan speed (Vy) in the Y-axis direction is set to 1 to 300 m/s. The energy (E) of the laser beam per one pulse is set to 0.07 to 50 μJ. The repetition frequency (H) of the laser beam is set to H=Vy/{D·(1−K)} MHz. When the width of the scan by the Y-axis scanner is defined as L mm, the scan speed (Vx) in the X-axis direction is set to Vx=D·(1−K)·Vy/L mm/s. The average output power (P) of the laser beam is set to P=E·Vy/{D·(1−K)} W.

Preferably, the Y-axis scanner is selected from any of an acousto-optic deflector (AOD), a resonant scanner, and a polygon scanner and the X-axis scanner is selected from any of a galvano scanner, a resonant scanner, and an X-axis direction feed mechanism that moves the chuck table in the X-axis direction. Preferably, the workpiece is a double-layer substrate in which a light emitting layer is stacked over an upper surface of a sapphire substrate with the intermediary of a buffer layer and a transfer substrate is disposed to face the light emitting layer, and the laser beam is transmitted through the sapphire substrate and breaks the buffer layer. Preferably, in the case in which the light emitting layer is stacked over the sapphire substrate, the wavelength of the laser beam is 143 nm to 266 nm.

According to the present invention, the average output power of the laser beam that forms the broken layer is suppressed to be low, and the occurrence of the situation in which heat accumulation occurs and damage is given to LEDs is avoided in the case of executing processing of forming the broken layer for the buffer layer that configures the double-layer substrate. Moreover, the time for forming the broken layer in the double-layer substrate also does not become a long time. Thus, although the spot diameter when the broken layer is formed is set small, the throughput does not lower and the light emitting layer can be efficiently transferred to the transfer substrate.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a block diagram illustrating the outline of an optical system that configures a laser beam irradiation unit disposed in the laser processing apparatus illustrated in FIG. 1;

DETAILED DESCRIPTION OF THE PREFERRED EMBODIMENT

Figure 1:
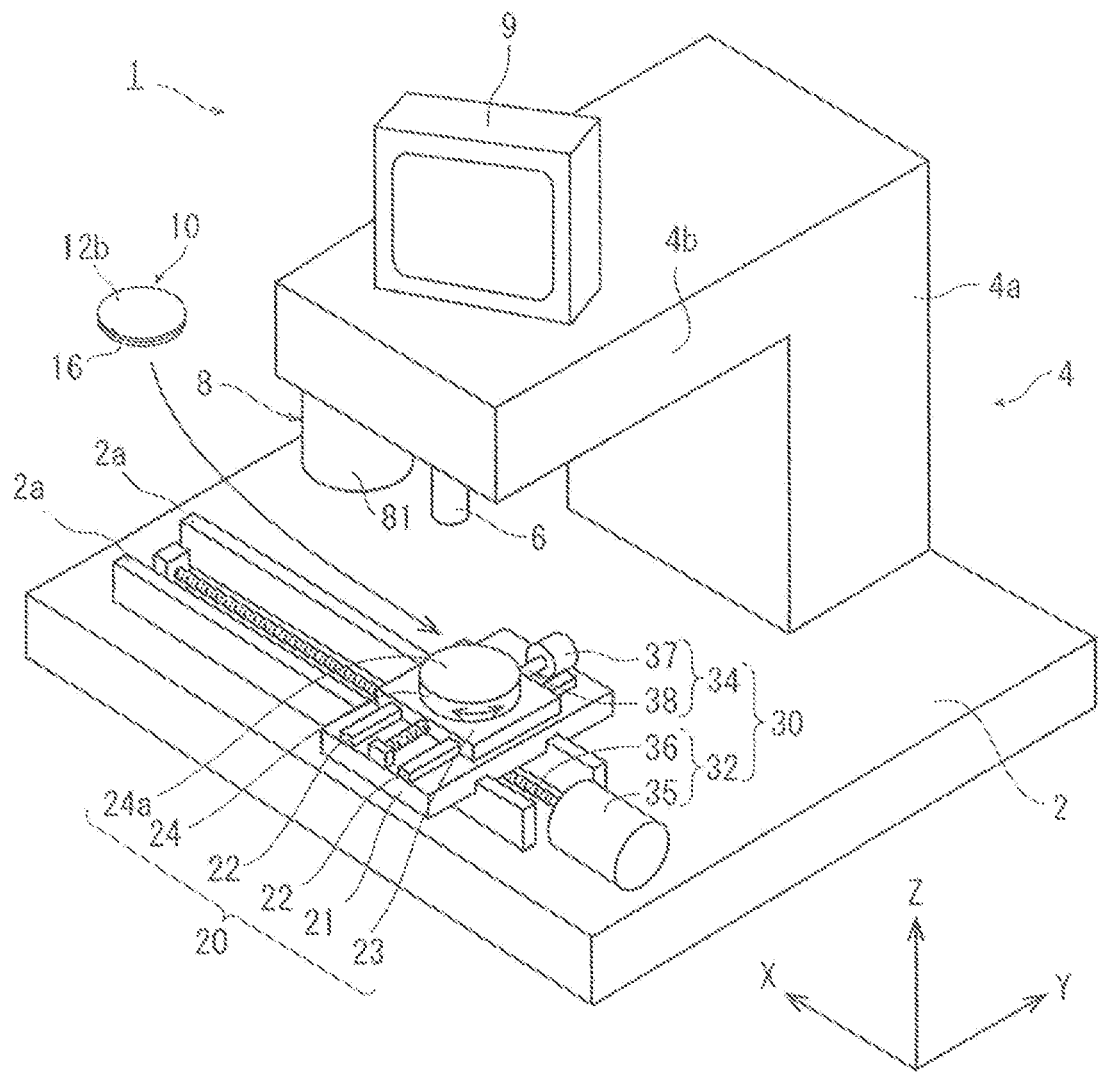
FIG. 1 is a perspective view of a laser processing apparatus of an embodiment of the present invention.

A laser processing apparatus according to an embodiment of the present invention will be described in detail below with reference to the accompanying drawings. In FIG. 1, an overall perspective view of a laser processing apparatus 1 of the present embodiment is illustrated. The laser processing apparatus 1 includes a holding unit 20 that holds a workpiece, a movement mechanism 30 that moves the holding unit 20, an alignment unit 6, a laser beam irradiation unit 8 that irradiates the workpiece held by the holding unit 20 with a laser beam, and a display unit 9.

The holding unit 20 includes a rectangular X-axis direction movable plate 21 placed over a base 2 movably in an X-axis direction indicated by an arrow X in the diagram, a rectangular Y-axis direction movable plate 23 that is placed over the X-axis direction movable plate 21 movably in a Y-axis direction indicated by an arrow Y in the diagram and is disposed on a pair of guide rails 22 disposed along the Y-axis direction on the X-axis direction movable plate 21, and a holding table 24 disposed on the upper surface of the Y-axis direction movable plate 23. The holding table 24 is configured rotatably by rotational drive means that is not illustrated in the diagram. A holding surface 24a that configures the upper surface of the holding table 24 and is defined by an X-axis and a Y-axis orthogonal to the direction of this X-axis is configured by a flat surface.

The movement mechanism 30 is disposed over the base 2 and includes an X-axis direction feed mechanism 32 that executes processing feed of the holding unit 20 in the X-axis direction and a Y-axis direction feed mechanism 34 that executes indexing feed of the Y-axis direction movable plate 23 in the Y-axis direction. The X-axis direction feed mechanism 32 converts rotational motion of a pulse motor 35 to linear motion through a ball screw 36 and transmits the linear motion to the X-axis direction movable plate 21 to cause the X-axis direction movable plate 21 to advance and retreat in the X-axis direction along guide rails 2a on the base 2. The Y-axis direction feed mechanism 34 converts rotational motion of a pulse motor 37 to linear motion through a ball screw 38 and transmits the linear motion to the Y-axis direction movable plate 23 to cause the Y-axis direction movable plate 23 to advance and retreat in the Y-axis direction along the guide rails 22 on the X-axis direction movable plate 21. Note that, although diagrammatic representation is omitted, position detecting means is disposed for the X-axis direction feed mechanism 32, the Y-axis direction feed mechanism 34, and the holding table 24, the position in the X-axis direction, the position in the Y-axis direction, and the rotational position regarding the holding table 24 are accurately detected and are transmitted to a control unit (diagrammatic representation is omitted) disposed in the laser processing apparatus 1. Then, by an instruction signal output from this control unit on the basis of the position information, the X-axis direction feed mechanism 32, the Y-axis direction feed mechanism 34, and the rotational drive means of the holding table 24 that is not illustrated in the diagram are driven, so that the holding table 24 can be positioned to a desired position.

As illustrated in FIG. 1, a frame body 4 is disposed upright on a lateral side of the movement mechanism 30. The frame body 4 includes a vertical wall part 4a disposed on the base 2 and a horizontal wall part 4b that extends in the horizontal direction from the upper end part of the vertical wall part 4a. An optical system of the laser beam irradiation unit 8 is housed inside the horizontal wall part 4b of the frame body 4. A beam condenser 81 included in this optical system and the alignment unit 6 are disposed on the lower surface of the tip part of the horizontal wall part 4b and irradiation with a laser beam from the beam condenser 81 is executed. The alignment unit 6 includes an illuminator that executes irradiation with a visible beam and an imaging element (charge-coupled device (CCD)) that images the workpiece by the visible beam. An image obtained by imaging by the alignment unit 6 is sent to the control unit and is displayed on the display unit 9.

With reference to FIG. 2, the outline of the configuration of the optical system of the laser beam irradiation unit 8 will be described. As illustrated in FIG. 2, the laser beam irradiation unit 8 includes a laser oscillator 82 that emits a pulsed laser beam LB, an attenuator 83 that adjusts the output power of the laser beam LB emitted from the laser oscillator 82, and a Y-axis scanner 84 that executes scanning (scan), at a high speed, with the laser beam LB emitted from the attenuator 83 along the Y-axis direction that defines the holding surface 24a of the holding table 24. The laser beam irradiation unit 8 includes also an X-axis scanner 85 that executes processing feed of the laser beam LB in the X-axis direction that defines the holding surface 24a of the holding table 24 and the beam condenser 81 that guides the laser beam LB that has passed through this optical system to a predetermined position on the holding table 24 perpendicularly and focuses the laser beam LB to execute irradiation.

Note that the Y-axis scanner 84 can be selected from well-known deflectors and is selected as appropriate from an acousto-optic element (AOD), a resonant scanner, a polygon scanner, and so forth, for example. It suffices that the X-axis scanner 85 is means having a function of executing processing feed of the laser beam LB emitted from the laser oscillator 82 in the X-axis direction that defines the holding surface 24a of the holding table 24, and the X-axis scanner 85 can be selected from a galvano scanner and a resonant scanner. As described later, the speed at which the Y-axis scanner 84 executes the scan on the holding surface 24a of the holding table 24 is set higher than the speed at which the X-axis scanner 85 executes the scan on the holding surface 24a. Furthermore, the X-axis scanner in the present invention is not limited to what is disposed in the optical system illustrated in FIG. 2 and it is also possible to employ the X-axis direction feed mechanism 32 that executes processing feed of the holding table 24 of the holding unit 20 in the X-axis direction as the X-axis scanner in the present invention.

The beam condenser 81 can employ an fθ lens 81a like one illustrated in the diagram, for example, and condenses the laser beam LB guided to the fθ lens 81a to irradiate the holding surface 24a of the holding table 24 with the laser beam LB perpendicularly. However, the beam condenser 81 is not limited to what employs the above-described fθ lens 81a and may be, for example, what uses a parabolic mirror and condenses the laser beam LB applied to a position different from the focus of the parabola that configures the parabolic mirror to emit the laser beam LB toward the holding table 24 perpendicularly. The laser processing apparatus 1 used for the present embodiment substantially includes the configuration described above. Functions and operation of the laser processing apparatus 1 of the present embodiment will be described below.

Figure 3A:
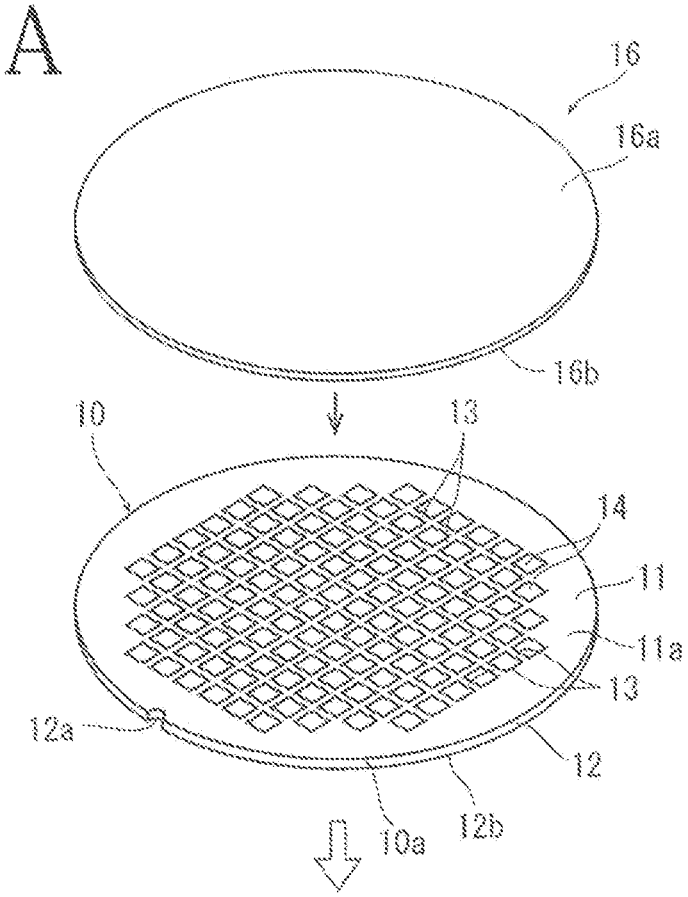
FIG. 3A is an exploded perspective view of a double-layer substrate that configures a workpiece.
Figure 3B:
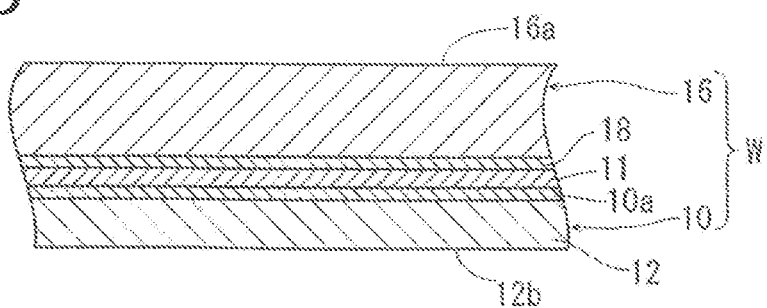
FIG. 3B is a partial enlarged sectional view of the double-layer substrate illustrated in FIG. 3A.

The workpiece processed by the laser processing apparatus 1 of the present embodiment will be described with reference to FIG. 3A and FIG. 3B. FIG. 3A is an exploded perspective view illustrating the workpiece and FIG. 3B is a partial enlarged sectional view of the integrated workpiece. As illustrated in the diagrams, the workpiece is a double-layer substrate W composed of a wafer 10 and a transfer substrate 16 disposed over a light emitting layer 11 formed over a surface of the wafer 10. In the wafer 10, a sapphire substrate 12 is employed as an epitaxy substrate. The light emitting layer 11 is stacked over the sapphire substrate 12. In the light emitting layer 11, plural light emitting devices 14 (LEDs) configured by an epitaxial layer composed of an n-type semiconductor layer and a p-type semiconductor layer (diagrammatic representation is omitted regarding both) formed by epitaxial growth over the sapphire substrate 12 with the intermediary of a buffer layer 10a and plural electrodes (diagrammatic representation is omitted) disposed on the n-type semiconductor layer and the p-type semiconductor layer are formed in such a manner as to be marked out by plural planned dividing lines 13 that intersect. The light emitting layer 11 is composed of gallium nitride (GaN), for example. However, the present invention is not limited thereto and the material of the light emitting layer 11 can be selected from well-known semiconductors such as gallium phosphide (GaP) and indium arsenide (InAs). The buffer layer 10a is formed of the same kind of material as the above-described light emitting layer 11. A notch 12a that indicates the crystal orientation of the sapphire substrate 12 is formed in the wafer 10. The transfer substrate 16 is formed of molybdenum, copper, silicon, or the like, for example, and is disposed to face the light emitting layer 11 with the intermediary of a joining metal layer 18 selected from gold, platinum, chromium, indium, palladium, and so forth (see FIG. 3B).

Figure 4A:
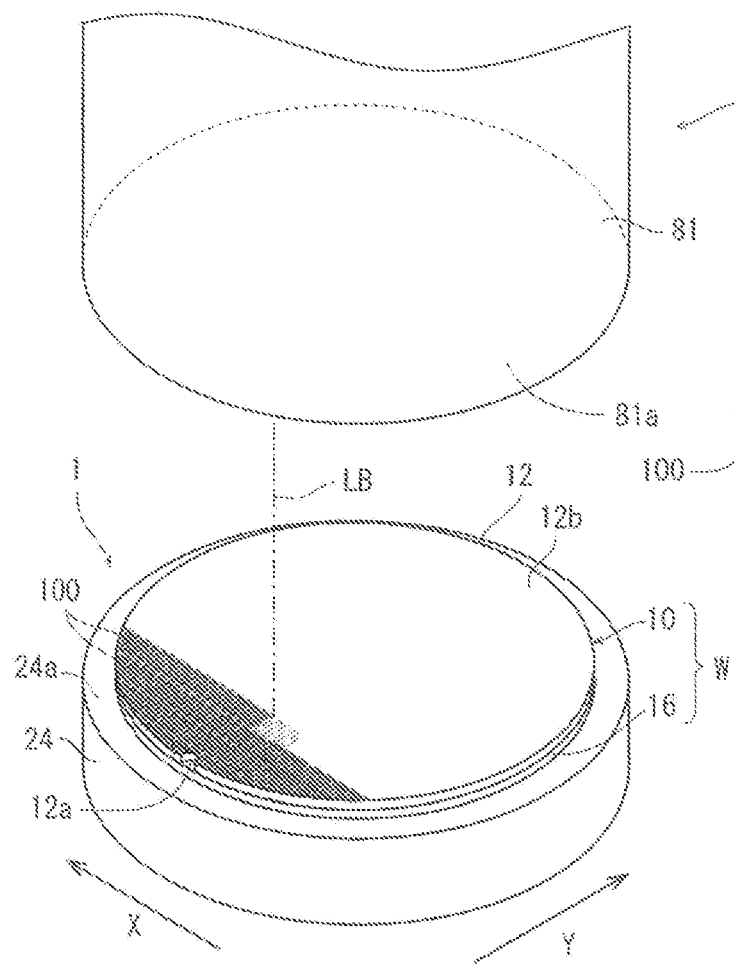
FIG. 4A is a perspective view illustrating the form of executing laser processing for the double-layer substrate.

The double-layer substrate W like the above-described one is prepared in advance and is conveyed to the above-described laser processing apparatus 1. Then, as illustrated in FIG. 4A, the double-layer substrate W is placed on the holding surface 24a of the holding table 24 in such a manner that the side of a back surface 12b of the sapphire substrate 12 that configures the wafer 10 is oriented upward and the side of the transfer substrate 16 is oriented downward, and is fixed by using an appropriate adhesive, wax, or the like.

Subsequently, the holding table 24 is moved in the X-axis direction and is positioned directly under the alignment unit 6. Then, imaging is executed from the side of the back surface 12b of the sapphire substrate 12 that configures the wafer 10 and position information of the outer edge, the notch 12a, and so forth of the double-layer substrate W is detected and is stored in the control unit.

Subsequently, based on the above-described detected position information of the double-layer substrate W, the double-layer substrate W is moved to directly under the beam condenser 81 of the laser beam irradiation unit 8 and the double-layer substrate W is positioned to a predetermined position. Then, as illustrated in FIG. 4B, the depth of a focal position P of the laser beam LB with which irradiation is executed is positioned to the buffer layer 10a formed between the sapphire substrate 12 and the light emitting layer 11.

After the focal position P of the laser beam LB has been positioned to the buffer layer 10a of the double-layer substrate W in the above-described manner, the double-layer substrate W is irradiated with the laser beam LB and laser processing is executed. The form of the irradiation with the laser beam LB will be described more specifically below.

Figure 4B:
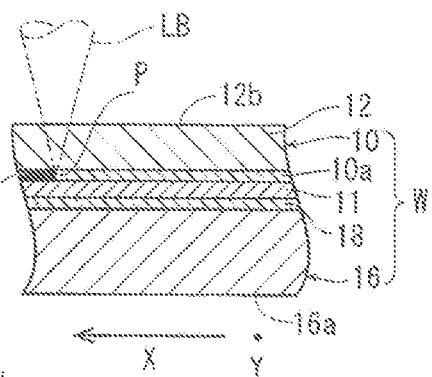
FIG. 4B is a partial enlarged sectional view of a wafer when the laser processing illustrated in FIG. 4A is executed.
Figure 4C:
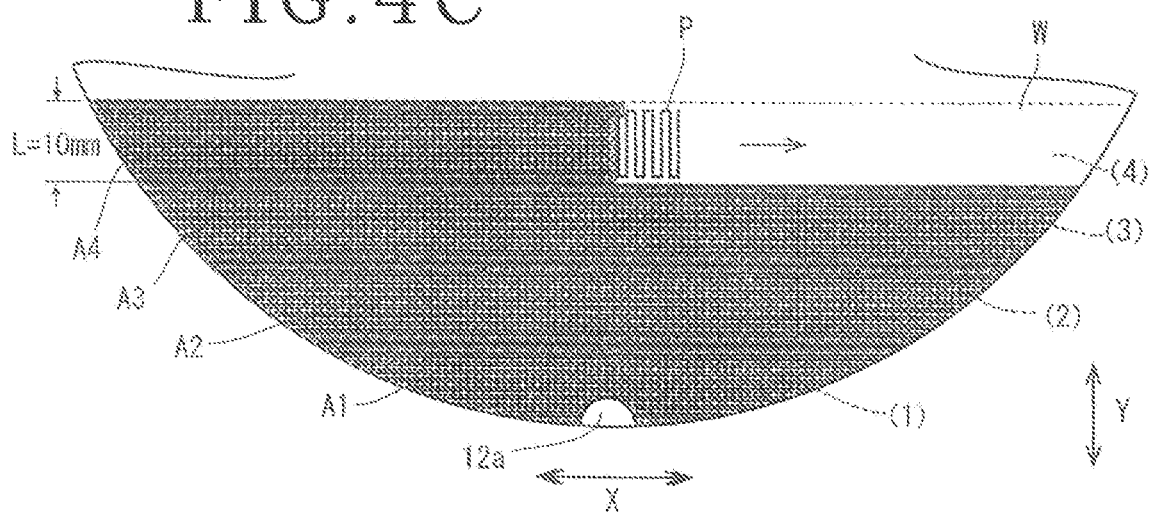
FIG. 4C is a plan view illustrating the form of executing the laser processing.

In the laser processing executed by the laser processing apparatus 1 of the present embodiment, as illustrated in FIG. 4C, a scan width (L) across which the scan is executed in the Y-axis direction by the Y-axis scanner 84 is set to an appropriate width (in the present embodiment, 10 mm), and the X-axis scanner 85 and the Y-axis scanner 84 are actuated to position the above-described focal position P of the laser beam LB to a left end position A1 of a row indicated by (1). Subsequently, in the state in which the double-layer substrate W is stopped, the laser oscillator 82 is actuated to execute irradiation with the laser beam LB and scanning is executed in the Y-axis direction by the scan width (L). Subsequently, the X-axis scanner 85 is actuated to execute processing feed in the X-axis direction by a distance (spot diameter (D)·(1−K)) that realizes an overlap rate (K) to be described later. Subsequently, the Y-axis scanner 84 is actuated again to execute scanning with the laser beam LB in the Y-axis direction by the scan width (L) as described above and thereafter processing feed is executed in the X-axis direction by the distance (spot diameter (D)·(1−K)) that realizes the overlap rate (K) to be described later again. The operation of the X-axis scanner 85 at this time is intermittent operation in which stop and actuation are repeated.

By repeating such scanning, as illustrated in FIG. 4C, the irradiation with the laser beam LB is executed across the whole of the first row (1) in the X-axis direction and a broken layer 100 is formed in the buffer layer 10a (see FIG. 4B). After the broken layer 100 has been formed as described above in the first row (1) of the double-layer substrate W, the Y-axis scanner 84 and the X-axis scanner 85 are actuated to position the focal position P of the laser beam LB to a left end position A2 of a row (2). Then, the broken layer 100 is formed across the whole region of the row (2) similarly to the above-described row (1). Similarly, also for a row (3) and a row (4), the above-described laser processing is executed in such a manner that left end positions A3 and A4 are employed as the processing start positions. Moreover, this is executed across the whole region in the Y-axis direction and the broken layer 100 is formed for the buffer layer 10a of the whole region of the double-layer substrate W.

Figure 5:
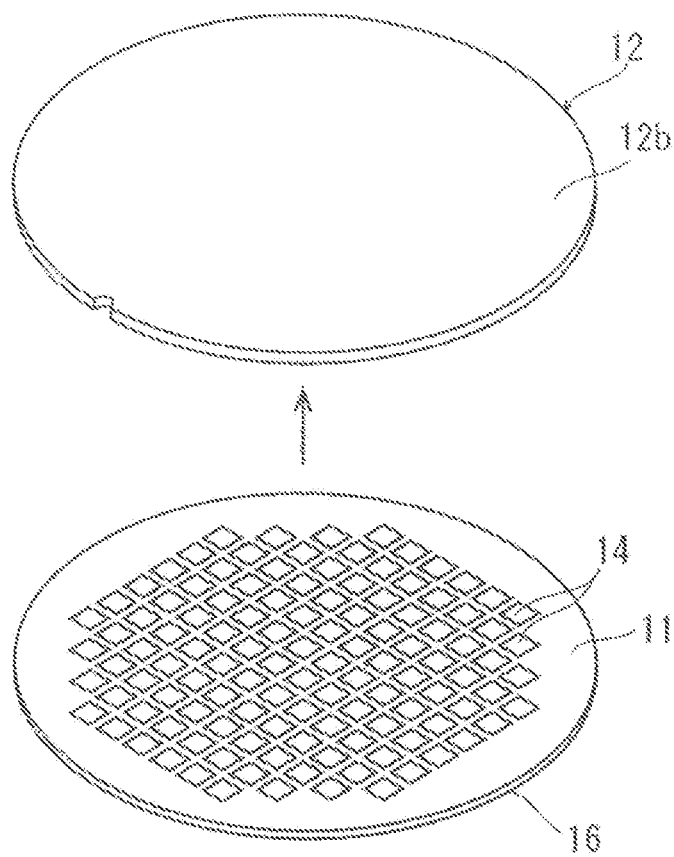
FIG. 5 is a perspective view illustrating the form of separating a sapphire substrate from the double-layer substrate.

After the broken layer 100 has been formed as described above, the sapphire substrate 12 is separated from the double-layer substrate W as illustrated in FIG. 5. Thereby, the light emitting layer 11 is transferred from the sapphire substrate 12 to the transfer substrate 16. Note that the sapphire substrate 12 separated from the double-layer substrate W is subjected to polishing and cleaning treatment and is reused.

It is important that the above-described laser processing of the present embodiment be executed in such a manner that setting is made to satisfy the following conditions.

Spot diameter (D): 5 to 60 μm
Spot overlap rate (K): 0.70 to 0.99 (70% to 99%)
Y-axis direction scan speed (Vy): 1 to 300 m/s
Energy (E) per one pulse: 0.07 to 50 μJ In the present embodiment, specifically, laser processing conditions are set as follows.

Spot diameter (D): 10 μm
Spot overlap rate (K): 0.90 (90%)
Y-axis direction scan speed (Vy): 50 m/s
Energy (E) per one pulse: 1 μJ
Y-axis direction scan width (L): 10 mm In the present embodiment, as described above, the sapphire substrate 12 is selected as the epitaxy substrate that configures the wafer 10. Thus, the wavelength of the laser beam LB oscillated by the laser oscillator 82 is set to such a wavelength as to be transmitted through the sapphire substrate 12 (143 to 266 nm). However, the present invention is not limited thereto and well-known another substrate (for example, SiC substrate) can be selected as the epitaxy substrate. In this case, irradiation with a laser beam with such a wavelength as to be transmitted through the selected material is executed.

In addition to being set to the above-described processing conditions, the laser processing apparatus 1 of the present embodiment is set to satisfy the following condition expressions regarding the repetition frequency (H) of the laser beam, the scan speed (Vx) in the X-axis direction, and the average output power (P) of the laser beam LB.

$$H = Vy/\{D \cdot (1-K)\} \text{ MHz}$$

$$Vx = D \cdot (1-K) Vy/L \text{ mm/s}$$

$$P = EVy/\{D \cdot (1-K)\} \text{ W}$$

That is, in the present embodiment, these parameters have the following values.

Repetition frequency (H)=50/{10·(1−0.90)}=50 MHz
X-axis direction scan speed (Vx)=10·(1−0.90)·50/10=5 mm/s
Average output power (P)=1.50/{10·(1−0.90)}=50 W Thus, the time to process a wafer with a diameter of 200 mm as described above is calculated as follows.

Processing time (T)=(200/5)·(200/10)·(3.14/4)=628 seconds (=10 minutes 28 seconds)

As described above, according to the present embodiment, the average output power (P) is suppressed to be comparatively low. Thus, even when the processing of forming the broken layer 100 is executed for the whole region of the double-layer substrate W, the occurrence of the situation in which heat accumulation occurs and damage is given to LEDs is avoided. Moreover, the time for forming the broken layer 100 in the whole region of the double-layer substrate W also does not become a long time. Thus, although the spot diameter (D) is set small, the throughput does not lower and the light emitting layer 11 can be efficiently transferred from the sapphire substrate 12 to the transfer substrate 16.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of operating a laser processing apparatus, the laser apparatus comprising:
a chuck table that holds a workpiece and includes a holding surface defined by an X-axis and a Y-axis; and
a laser beam irradiation unit that irradiates the workpiece held by the chuck table with a laser beam and forms a broken layer, wherein
the laser beam irradiation unit includes
a laser oscillator that emits the laser beam,
a Y-axis scanner that executes a high-speed scan with the laser beam emitted from the laser oscillator in a Y-axis direction,
an X-axis scanner that executes processing feed of the laser beam emitted from the laser oscillator in an X-axis direction, and
a beam condenser,
wherein the beam condenser is configured to output a spot diameter (D) of the laser beam with which the workpiece is irradiated of 5 to 60 μm, wherein the beam condenser and the X-axis scanner are configured to output an overlap rate (K) of a spot of the laser beam of 0.70 to 0.99, wherein the Y-axis scanner is configured to output a scan speed (Vy) in the Y-axis direction of 1 to 300 m/s, and wherein the laser oscillator is configured to output an energy (E) of the laser beam per one pulse of 0.07 to 50 μJ,
the method comprising the steps of:
scanning the workpiece with the laser beam wherein a repetition frequency (H) of the laser beam is set to:

$$H = Vy/\{D \cdot (1-K)\} \text{ MHz,}$$

a scan speed (Vx) in the X-axis direction is set to:

$$Vx = D \cdot (1-K) \cdot Vy/L \text{ mm/s,}$$

where a width of the scan by the Y-axis scanner is defined as L mm, and
an average output power (P) of the laser beam is set to:

$$P = E \cdot Vy/\{D \cdot (1-K)\} \text{ W.}$$

* * * * *